United States Patent
Chen

(10) Patent No.: US 10,784,337 B2
(45) Date of Patent: Sep. 22, 2020

(54) MOSFET AND A METHOD FOR MANUFACTURING THE SAME

(71) Applicant: SHANGHAI HUAHONG GRACE SEMICONDUCTOR MANUFACTURING CORPORATION, Shanghai (CN)

(72) Inventor: Yu Chen, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/529,990

(22) Filed: Aug. 2, 2019

(65) Prior Publication Data
US 2019/0371884 A1 Dec. 5, 2019

Related U.S. Application Data

(62) Division of application No. 15/363,288, filed on Nov. 29, 2016, now abandoned.

(30) Foreign Application Priority Data

Jul. 19, 2016 (CN) .......................... 2016 1 0566545

(51) Int. Cl.
*H01L 29/06* (2006.01)
*H01L 29/66* (2006.01)
(Continued)

(52) U.S. Cl.
CPC .... *H01L 29/0615* (2013.01); *H01L 29/42368* (2013.01); *H01L 29/4983* (2013.01);
(Continued)

(58) Field of Classification Search
CPC ........................ H01L 29/0615; H01L 29/7835
See application file for complete search history.

(56) References Cited

U.S. PATENT DOCUMENTS 5,741,737 A * 4/1998 Kachelmeier ..... H01L 21/28167
438/286
5,801,416 A 9/1998 Choi et al.
(Continued)

FOREIGN PATENT DOCUMENTS

CN 104037223 A 9/2014

OTHER PUBLICATIONS

Non-Final Office Action issued in corresponding U.S. Appl. No. 15/363,288 dated Jul. 21, 2017.
(Continued)

*Primary Examiner* — Eugene Lee
(74) *Attorney, Agent, or Firm* — MKG, LLC

(57) ABSTRACT

A method of manufacturing a MOSFET is presented. The method includes forming the MOSFET wherein a source region and a drain region are unsymmetrical in structure, with the horizontal junction depth of the drain region greater than the source region, and the vertical junction depth of the drain region greater than the source region; the breakdown voltage of the device is raised by increasing the horizontal and vertical junction depths of the drain region, and the horizontal dimension of the device is diminished by reducing the horizontal and vertical junction depths of the source region. In one embodiment, the formed MOSFET includes a gate dielectric layer that is unsymmetrical in structure—and the GIDL effect in the device is reduced by increasing the thickness of the first gate dielectric section, and the driving current of the device is increased by reducing the thickness of the second gate dielectric section.

8 Claims, 4 Drawing Sheets

(51) Int. Cl.
*H01L 29/423* (2006.01)
*H01L 29/49* (2006.01)
*H01L 29/78* (2006.01)

(52) U.S. Cl.
CPC .... *H01L 29/6659* (2013.01); *H01L 29/66659* (2013.01); *H01L 29/7835* (2013.01)

(56) References Cited

U.S. PATENT DOCUMENTS

| | | | | |
|---|---|---|---|---|
| 6,110,783 | A * | 8/2000 | Burr | H01L 21/28105 257/E21.196 |
| 8,080,845 | B2 | 12/2011 | Shima | |
| 8,324,042 | B2 * | 12/2012 | Cai | H01L 29/0847 438/231 |
| 8,809,952 | B2 * | 8/2014 | Landgraf | H01L 21/02107 257/339 |
| 8,822,291 | B2 * | 9/2014 | Zhang | H01L 21/26506 438/286 |
| 9,698,258 | B2 * | 7/2017 | Ryu | H01L 29/7835 |
| 2003/0141559 | A1 * | 7/2003 | Moscatelli | H01L 21/28167 257/406 |
| 2006/0194380 | A1 | 8/2006 | Chen et al. | |
| 2009/0321824 | A1 | 12/2009 | Shima | |
| 2010/0148258 | A1 * | 6/2010 | Cho | H01L 29/42368 257/343 |
| 2011/0241112 | A1 * | 10/2011 | Zuniga | H01L 29/1095 257/343 |
| 2012/0273879 | A1 * | 11/2012 | Mallikarjunaswamy | H01L 29/4175 257/335 |
| 2014/0252499 | A1 | 9/2014 | Lin et al. | |
| 2016/0027899 | A1 | 1/2016 | Kim et al. | |
| 2016/0315198 | A1 | 10/2016 | Inoue et al. | |

OTHER PUBLICATIONS

Final Office Action issued in corresponding U.S. Appl. No. 15/363,288 dated Dec. 8, 2017.
Non-Final Office Action issued in corresponding U.S. Appl. No. 15/363,288 dated Nov. 13, 2018.
Search Report issued in corresponding Chinese Patent Application No. 2016105665458 dated Jan. 28, 2016.
Final Office Action issued in corresponding U.S. Appl. No. 15/363,288 dated May 3, 2019.
First Examination Report issued in correspondinging Chinese Patent Application No. 201610566545.8, dated Oct. 8, 2018.
Third Examination Report issued in correspondinging Chinese Patent Application No. 201610566545.8, dated May 5, 2019.

* cited by examiner

MOSFET AND A METHOD FOR MANUFACTURING THE SAME

CROSS REFERENCE TO RELATED APPLICATIONS

The present application is a divisional application of U.S. patent application Ser. No. 15/363,288, filed on Nov. 29, 2016, which claims priority to Chinese Patent Application No. 201610566545.8, filed on Jul. 19, 2016. The entireties of these patent documents are incorporated by reference herein.

TECHNICAL FIELD

The present invention relates to the field of semiconductor integrated circuit, more particularly to a metal-oxide semiconductor field-effect transistor (MOSFET); the present invention further relates to a method for manufacturing the MOSFET.

BACKGROUND OF THE INVENTION

For MOS devices frequently used in current semiconductor fabrication technology, the existing MOSFET is structured as shown in FIG. 1. Taking an N-type MOSFET as an example, the existing MOSFET includes:

P-type well region 101 formed in the surface of the semiconductor substrate.

A gate dielectric layer, such as a gate oxide layer 102, and a polysilicon gate sequentially formed on the surface of said well region 101.

Side walls 105 formed on both sides of said polysilicon gate 103.

Lightly doped drain regions 104 and heavily doped source/drain implanted regions 106 are formed in said well region 101 on both sides of said polysilicon gate 103, wherein said lightly doped drain regions 104 are self-aligned with the sides of said polysilicon gate 103, and said source/drain implanted regions 106 are self-aligned with the sides of said side walls 105 on both sides of said polysilicon gate 103. The overlap between said lightly doped drain region 104 and said source/drain implanted region 106 on one side of said polysilicon gate 103 constitutes the source region, and the overlap between said lightly doped drain region 104 and said source/drain implanted region 106 on the other side of said polysilicon gate 103 constitutes the drain region.

As described in FIG. 1, said source region and said drain region of the existing MOSFET are totally symmetrical and have identical performance, such as breakdown voltage, parasitic resistance and capacitance.

For the existing structure, the breakdown voltage of the device needs to be raised by increasing the concentration of impurity in the source and drain regions, and the junction depths of the source and drain regions. To avoid source/drain punch through, the channel of the device will have to be increased accordingly with the junction depths of the source and drain regions, so raising the breakdown voltage of the device is in contradiction with reducing the dimensions of the device. For power-related applications which need an array of devices, the increase in the size of individual devices significantly influences the size of the whole chip.

At the same time, in prior art, the thickness of gate oxide layer 102 of the device needs to be reduced, in order to reduce the gate-induced drain leakage (GIDL) current, which is induced by the high electric field between gate and drain, around the border between the source and drain junctions and polysilicon gate 103. However, the thickening of gate oxide layer 102 will be accompanied by the weakening of the current driving capability of the device, so in the existing structure, reducing GIDL is in contradiction with increasing the current driving capability of the device.

SUMMARY OF THE INVENTION

The present invention aims to provide a MOSFET, which increases the breakdown voltage of the device while reducing its dimensions, and reduces the GIDL effect in the device while increasing its current driving capability.

To solve e.g., the above technological problems, the MOSFET provided in the present invention includes:

A well region of the second conductivity type formed in the surface of the semiconductor substrate;

A gate dielectric layer and a polysilicon gate sequentially formed on the surface of the well region;

A doped source region of the first conductivity type and a doped drain region of the first conductivity type respectively formed in the surface of the well region;

Wherein, the drain region is self-aligned with a first side of said polysilicon gate, and the source region is self-aligned with a second side of said polysilicon gate.

The source region and the drain region are unsymmetrical in structure, wherein the horizontal junction depth of the drain region is greater than that of the source region, and the vertical junction depth of the drain region is greater than that of the source region; the breakdown voltage of the device can be raised by increasing the horizontal and vertical junction depths of said drain region, and the horizontal dimension of the device can be diminished by reducing the horizontal and vertical junction depths of the source region.

The gate dielectric layer is unsymmetrical in structure, wherein the gate dielectric layer includes a first gate dielectric section and a second gate dielectric section which are horizontally connected; the thickness of the first gate dielectric section is greater than that of the second gate dielectric section; horizontally, the drain region extends beyond the first side of the polysilicon gate to the bottom of the polysilicon gate, thereby forming an overlap between the drain region and the polysilicon gate, with the first gate dielectric section located therein; and the GIDL effect in the device can be reduced by increasing the thickness of the first gate dielectric section, and the driving current of the device can be increased by reducing the thickness of the second gate dielectric section.

As a further improvement, the semiconductor substrate is a silicon substrate.

As a further improvement, the source region is formed by a heavily doped source/drain implanted region having the first conductivity type, the drain region is formed by an overlap between the heavily doped source/drain implanted region and a lightly doped drain region having the first conductivity type, the source/drain implanted region of the source region and the source/drain implanted region of the drain region are formed by the same process, and the junction depth of the drain region is adjusted through the lightly doped drain region.

As a further improvement, the gate dielectric layer is a gate oxide layer.

As a further improvement, the second gate dielectric section is a thermal oxide layer or deposited oxide layer, and the first gate dielectric section adds a local oxide layer to the second gate dielectric section.

As a further improvement, side walls are formed on the sides of the polysilicon gate.

As a further improvement, the MOSFET is an N-type device, with the first conductivity type being N-type and the second conductivity type being P-type; alternatively, the MOSFET is a P-type device, with the first conductivity type being P-type and the second conductivity type being N-type.

To solve the above technological problems, the method for manufacturing a MOSFET provided in the present invention includes:

Step 1: providing a semiconductor substrate and introducing dopant having the second conductivity type in the surface thereof to form a well region;

Step 2: forming a first oxide layer on the surface of the semiconductor substrate by thermal oxidation or chemical vapor deposition;

Step 3: forming a polysilicon gate on the surface of the first oxide layer by chemical vapor deposition and photolithography, wherein the polysilicon gate covers the surface of the well region via the first oxide layer;

Step 4: forming a first dielectric layer by chemical vapor deposition, wherein the first dielectric layer is made of silicon nitride or silicon oxynitride;

Step 5: removing the first dielectric layer in the drain-forming region with photolithography and etching processes, while retaining the first dielectric layer in the source-forming region, wherein the drain-forming region is located outside a first side of the polysilicon gate, the source-forming region is located outside a second side of the polysilicon gate, the reserved part of the first dielectric layer further extends from the source-forming region to the top of the polysilicon gate, and the removed part of the first dielectric layer further extends from the drain-forming region to the top of the polysilicon gate.

Step 6: with the photoresist on the first dielectric layer and the top thereof as a mask, conducting ion implantation of dopants having the first conductivity type to form a lightly doped drain region, wherein the lightly doped drain region is self-aligned with the first side of the polysilicon gate; the junction depth of the drain region is adjusted through ion implantation of the lightly doped drain region; and horizontally, the lightly doped drain region extends from the first side of the polysilicon gate to the bottom thereof, thereby forming an overlap between the drain region and the polysilicon gate;

Step 7: removing the photoresist on the top of the first dielectric layer, and with the first dielectric layer as a mask, performing local thermal oxidation to form a local thermal oxide layer, wherein the local thermal oxide layer extends from the drain-forming region to the bottom of the polysilicon gate, and then removing the first dielectric layer;

The overlap between the local thermal oxide layer extending to the bottom of the polysilicon gate and the first oxide layer constitutes a first gate dielectric section, and the part of the first oxide layer located at the bottom of the polysilicon gate and not overlaid with the local thermal oxide layer constitutes a second gate dielectric section;

The first gate dielectric section and the second gate dielectric section are connected horizontally to form a gate dielectric layer; the first gate dielectric section is located in the overlap between the drain region and the polysilicon gate; the GIDL effect in the device can be reduced by increasing the thickness of the first gate dielectric section, and the driving current of the device can be increased by reducing the thickness of the second gate dielectric section.

Step 8: performing source/drain implantation of impurity having the first conductivity type to form heavily doped source/drain implanted regions on both sides of the polysilicon gate, wherein each the source/drain implanted region is self-aligned with a corresponding side of the polysilicon gate, the overlap between the source/drain implanted region on the first side of the polysilicon gate and the lightly doped drain region forms a drain region, and the source/drain implanted region on the second side of the polysilicon gate forms a source region.

The source region and the drain region are unsymmetrical in structure, wherein the horizontal junction depth of the drain region is greater than that of the source region, and the vertical junction depth of the drain region is greater than that of the source region; the breakdown voltage of the device can be raised by increasing the horizontal and vertical junction depths of the drain region, and the horizontal dimension of the device can be diminished by reducing the horizontal and vertical junction depths of the source region.

As a further improvement, the semiconductor substrate is a silicon substrate.

As a further improvement, prior to performing the source/drain implantation in Step 8, side walls are formed on the sides of the polysilicon gate by deposition and etching processes.

When performing source/drain implantation, the side walls on the two sides of the polysilicon gate are taken as the boundaries for self-alignment, the source/drain implantation is performed at a tilt angle, the source/drain implanted regions formed thereby extend horizontally to the bottom of the side walls, and the breadth of the horizontal extension of the source/drain implanted regions is greater than the maximum horizontal breadth of the side walls.

As a further improvement, the angle between the ion beam and the vertical direction is greater than 10 degrees, and the implantation dose exceeds $5E14$ $cm^{-2}$ in source/drain implantation.

As a further improvement, the angle between the ion beam and the vertical direction is greater than 10 degrees, and the implantation dose exceeds $5E14$ $cm^{-2}$ in ion implantation of dopants to form a lightly doped drain region in Step 6.

As a further improvement, the thickness of the first dielectric layer is between 50 and 300 angstroms.

As a further improvement, the thickness of the local thermal oxide layer is between 30 and 300 angstroms.

As a further improvement, the MOSFET is an N-type device, with the first conductivity type being N-type and the second conductivity type being P-type; alternatively, the MOSFET is a P-type device, with the first conductivity type being P-type and the second conductivity type being N-type.

In the present invention, the source region and the drain region being configured to be unsymmetrical in structure makes it possible to increase the breakdown voltage of the device by increasing the horizontal and vertical junction depths of the drain region alone; configured as independent of the drain region in the present invention, the source region needs not be able to endure a high voltage, so the junction depth of the source region is configured to be smaller than that of the drain region, which means the horizontal dimension of the device can be diminished by reducing the horizontal and vertical junction depths of the source region; that is to say, the source region in the present invention can adopt a relatively smaller junction depth, thereby reducing the dimensions of the device; therefore, the present invention can increase the breakdown voltage of the device while reducing the dimensions thereof.

In the present invention, the drain region adopts a relatively greater junction depth, and horizontally extends from the first side of the polysilicon gate to the bottom thereof, thereby forming an overlap between the drain region and the polysilicon gate. The gate dielectric layer is divided into two sections, the location of the first gate dielectric section coincides with the overlap, and the relative position between the two can be adjusted by self-alignment to locate the first gate dielectric section in the overlap between the drain region and the polysilicon gate. In accordance with the present invention, the GIDL effect in the device can be reduced by increasing the thickness of the first gate dielectric section, and the driving current of the device can be increased by reducing the thickness of the second gate dielectric section. Therefore, the present invention can reduce the GIDL effect in the device and at the same time increase its current driving capability.

BRIEF DESCRIPTION OF THE DRAWINGS

The present invention will be described in detail by reference to the accompanying drawings and specific embodiments.

DETAILED DESCRIPTION OF THE EMBODIMENTS

Figure 1:
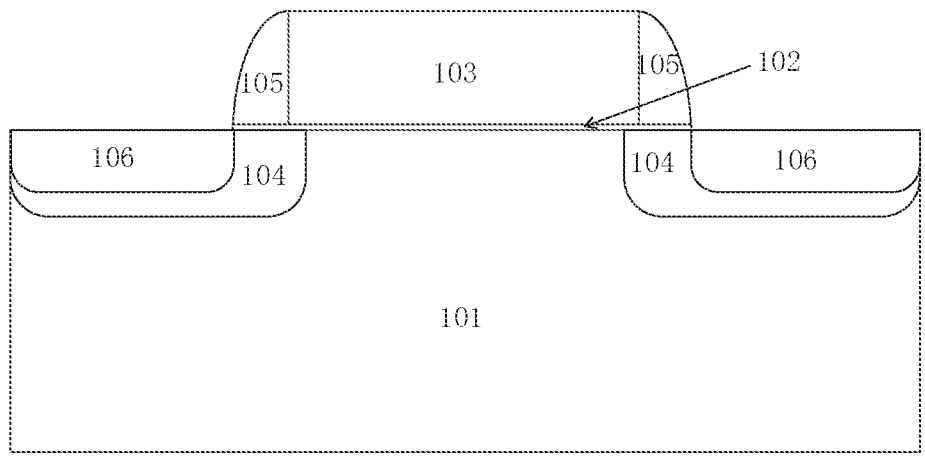
FIG. 1 describes the structure of the existing (prior art) MOSFET.

As shown in FIGS. 3A-3E, which describe the device structures in each step of the manufacturing process for MOSFET in accordance with the embodiment of the present invention, the MOSFET in accordance with the embodiment of the present invention includes:

A well region 1 of the second conductivity type formed in the surface of the semiconductor substrate. Preferably, the semiconductor substrate is a silicon substrate.

A gate dielectric layer and a polysilicon gate 3 sequentially formed on the surface of well region 1.

A doped source region of the first conductivity type and a doped drain region of the first conductivity type respectively formed in the surface of well region 1. Preferably, the source region is formed by a heavily doped source/drain implanted region 7 having the first conductivity type, the drain region is formed by an overlap between heavily doped source/drain implanted region 7 and a lightly doped drain region 5 having the first conductivity type, source/drain implanted region 7 of the source region and source/drain implanted region 7 of the drain region are formed by the same process, and the junction depth of the drain region is adjusted through lightly doped drain region 5.

Figure 2:
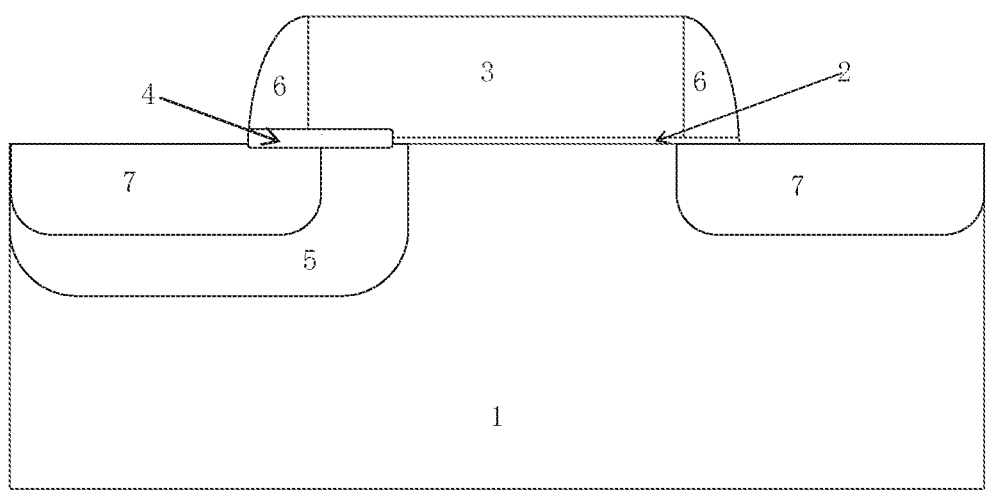
FIG. 2 describes the structure of the MOSFET in accordance with an embodiment of the present invention.

Side walls 6 formed on the sides of polysilicon gate 3, wherein the drain region is self-aligned with the first side of polysilicon gate 3 and the source region is self-aligned with the other side of polysilicon gate 3. Preferably, each source/drain implanted region 7 is self-aligned with the side wall 6 on the corresponding side of polysilicon gate 3, and horizontally extends to the bottom of polysilicon gate 3 on the corresponding side, with the breadth of the horizontal extension of source/drain implanted regions 7 to the bottom of polysilicon gate 3 being greater than the maximum horizontal breadth of side walls 6. Lightly doped drain region 5 is self-aligned with the first side of polysilicon gate 3, and horizontally extends from the first side of polysilicon gate 3 to the bottom thereof, thereby forming an overlap between the drain region and polysilicon gate 3;

As shown in FIG. 2, in accordance with an embodiment of the present invention, the source region and the drain region are unsymmetrical in structure, wherein the horizontal junction depth of the drain region is greater than that of the source region, and the vertical junction depth of the drain region is greater than that of the source region; the breakdown voltage of the device can be raised by increasing the horizontal and vertical junction depths of the drain region, and the horizontal dimension of the device can be diminished by reducing the horizontal and vertical junction depths of the source region.

The gate dielectric layer is unsymmetrical in structure, wherein the gate dielectric layer includes a first gate dielectric section 4 and a second gate dielectric section 2 which are horizontally connected; the thickness of first gate dielectric section 4 is greater than that of second gate dielectric section 2; first gate dielectric section 4 is located in the overlap between the drain region and polysilicon gate 3; and the GIDL effect in the device can be reduced by increasing the thickness of first gate dielectric section 4, and the driving current of the device can be increased by reducing the thickness of second gate dielectric section 2. Preferably, second gate dielectric section 2 is a thermal oxide layer or deposited oxide layer, and first gate dielectric section 4 adds a local oxide layer to second gate dielectric section 2.

In accordance with an embodiment of the present invention, the MOSFET is an N-type device, with the first conductivity type being N-type and the second conductivity type being P-type; alternatively, the MOSFET is a P-type device, with the first conductivity type being P-type and the second conductivity type being N-type.

FIGS. 3A-3E describe the device structures in each step of the manufacturing process for MOSFET in accordance with an embodiment of the present invention. A method of manufacturing the MOSFET in accordance with an embodiment, comprising the steps of Step 1: as shown in 3A, providing a semiconductor substrate and introducing dopant having the second conductivity type in the surface thereof to form well region 1. Preferably, said semiconductor substrate is a silicon substrate.

Step 2: as shown in 3A, forming first oxide layer 2 on the surface of said semiconductor substrate by thermal oxidation or chemical vapor deposition.

Step 3: as shown in 3A, forming polysilicon gate 3 on the surface of first oxide layer 2 by chemical vapor deposition and photolithography, wherein polysilicon gate 3 covers the surface of well region 1 via first oxide layer 2.

Step 4: as shown in 3B, forming a first dielectric layer 201 by chemical vapor deposition, wherein first dielectric layer 201 is made of silicon nitride or silicon oxynitride. Preferably, the thickness of first dielectric layer 201 is between 50 and 300 angstroms.

Figure 3A:
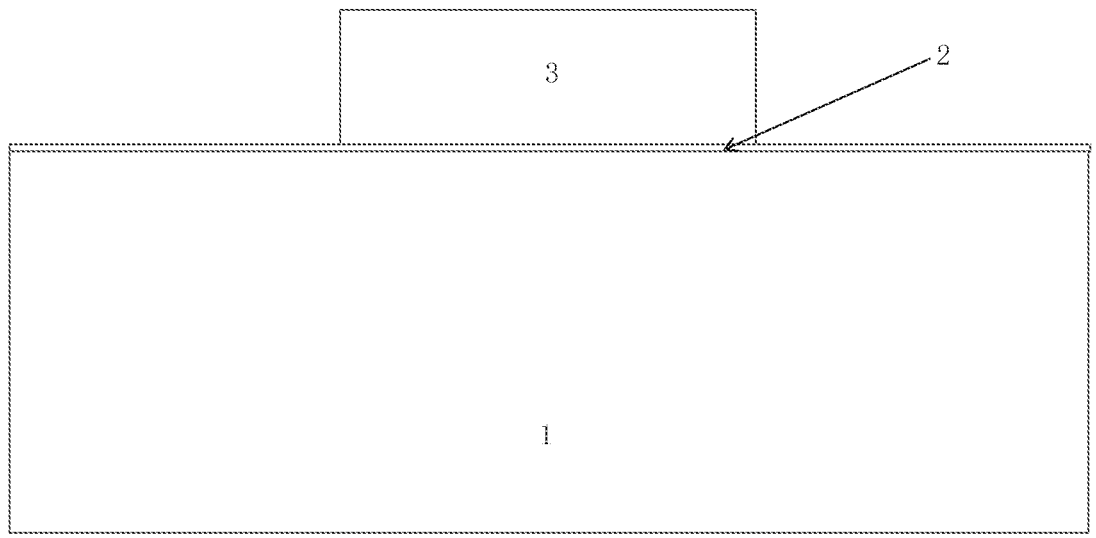
FIGS. 3A-3E describe the device structures in each step of the manufacturing process for MOSFET in accordance with an embodiment of the present invention.
Figure 3B:
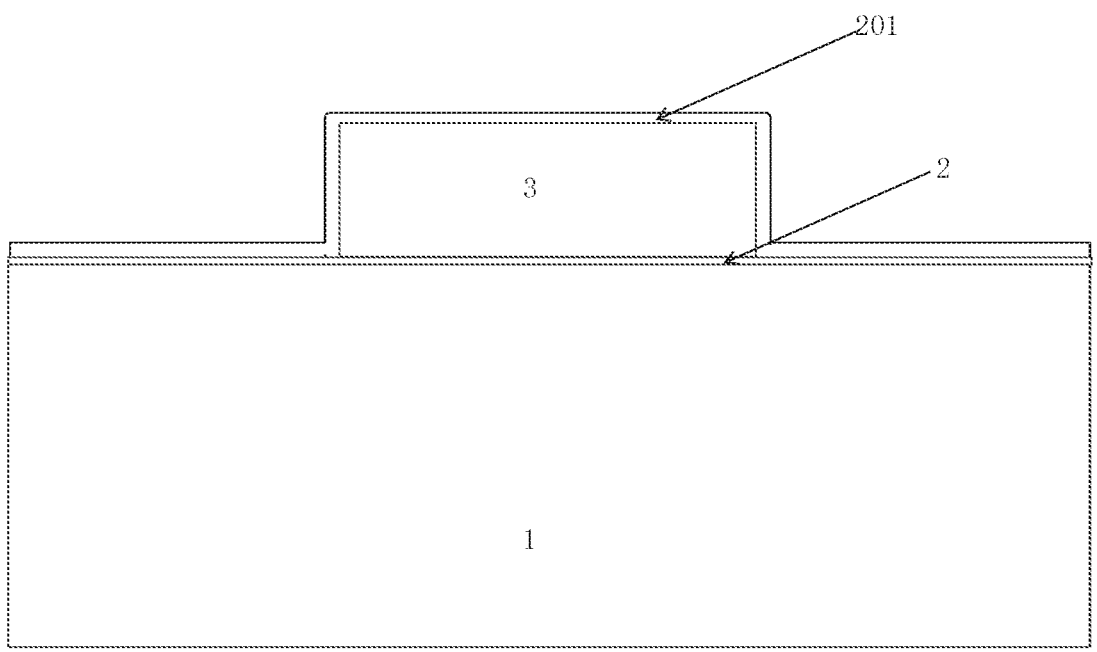
Figure 3C:
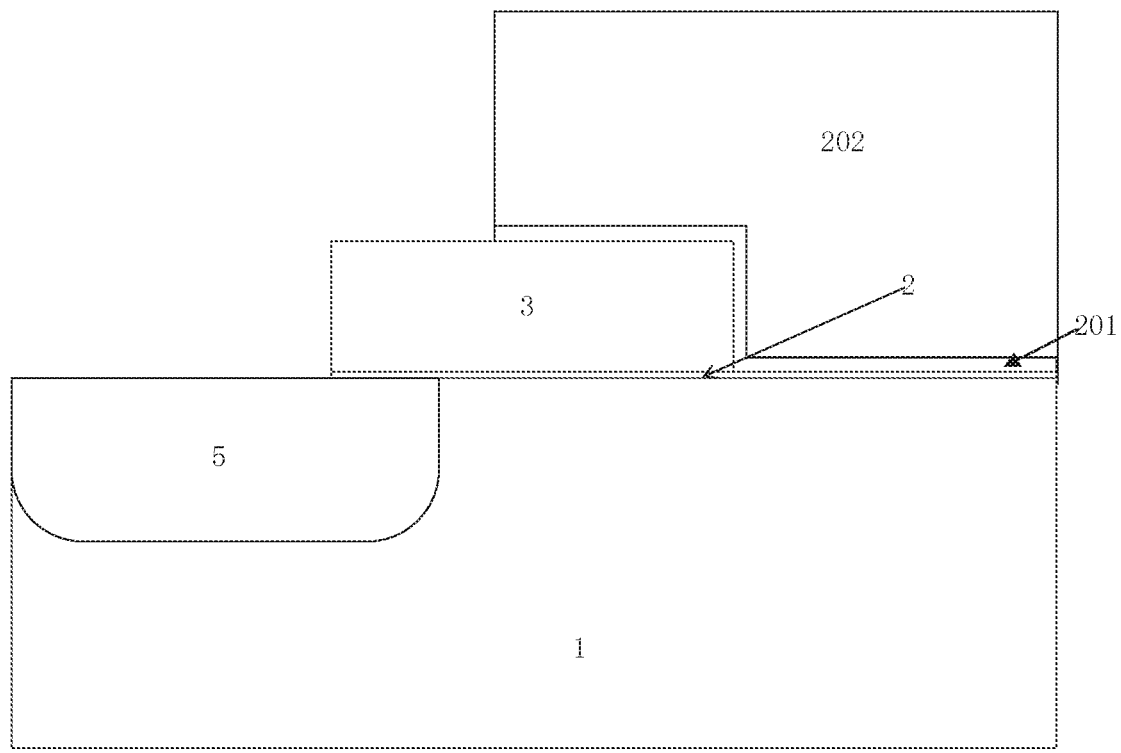

Step 5: as shown in FIG. 3C, forming the pattern of a photoresist 202 with photolithography, removing first dielectric layer 201 in the drain-forming region with etching process, while retaining first dielectric layer 201 in the source-forming region, wherein the drain-forming region is located outside the first side of polysilicon gate 3, the source-forming region is located outside the second side of polysilicon gate 3, the reserved part of first dielectric layer 201 further extends from the source-forming region to the top of polysilicon gate 3, and the removed part of first dielectric layer 201 further extends from the drain-forming region to the top of polysilicon gate 3.

Step 6: as shown in FIG. 3C, with photoresist 202 on first dielectric layer 201 and the top thereof as a mask, conducting ion implantation of dopants having the first conductivity type to form a lightly doped drain region 5, wherein lightly doped drain region 5 is self-aligned with the first side of polysilicon gate 3; the junction depth of the drain region is adjusted through ion implantation of lightly doped drain region 5; and horizontally, lightly doped drain region 5 extends from the first side of polysilicon gate 3 to the bottom thereof, thereby forming an overlap between the drain region and polysilicon gate 3. Preferably, the angle between the ion beam and the vertical direction is greater than 10 degrees, and the implantation dose exceeds 5E14 cm² in source/drain implantation.

Figure 3D:
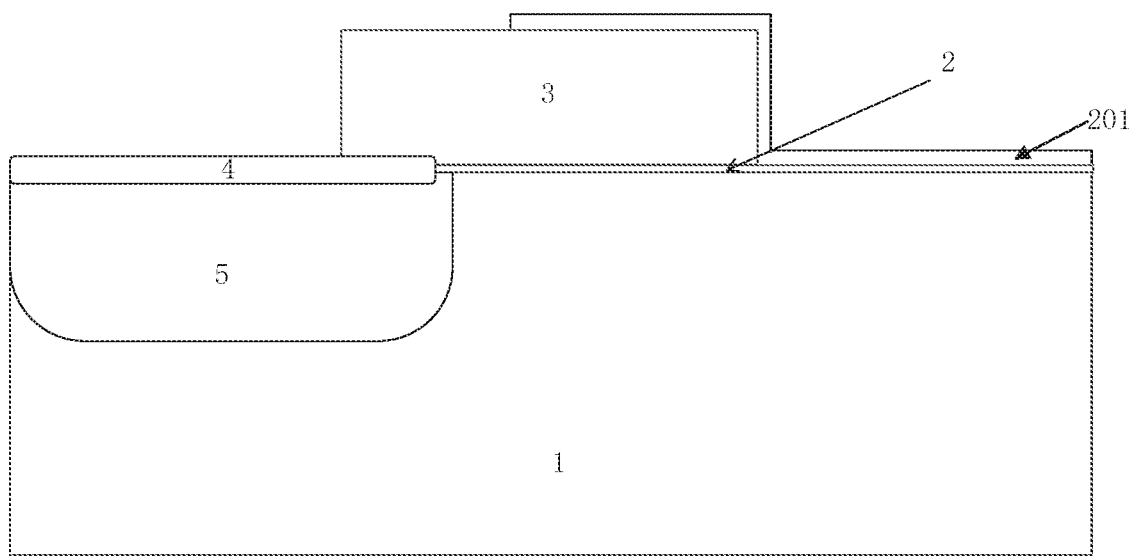

Step 7: as shown in FIG. 3D, removing photoresist 202 on the top of first dielectric layer 201, and using first dielectric layer 201 as a mask, performing local thermal oxidation to form a local thermal oxide layer 4, wherein local thermal oxide layer 4 extends from the drain-forming region to the bottom of polysilicon gate 3, and then removing first dielectric layer 201. Preferably, the thickness of local thermal oxide layer 4 is between 30 and 300 angstroms.

The overlap between local thermal oxide layer 4 extending to the bottom of polysilicon gate 3 and first oxide layer 2 constitutes first gate dielectric section 4, and first oxide layer 2 located at the bottom of polysilicon gate 3 and not overlaid with local thermal oxide layer 4 constitutes second gate dielectric section 2;

First gate dielectric section 4 and second gate dielectric section 2 are horizontally connected to form the gate dielectric layer; first gate dielectric section 4 is located in the overlap between the drain region and polysilicon gate 3; the GIDL effect in the device can be reduced by increasing the thickness of first gate dielectric section 4, and the driving current of the device can be increased by reducing the thickness of second gate dielectric section 2.

Figure 3E:
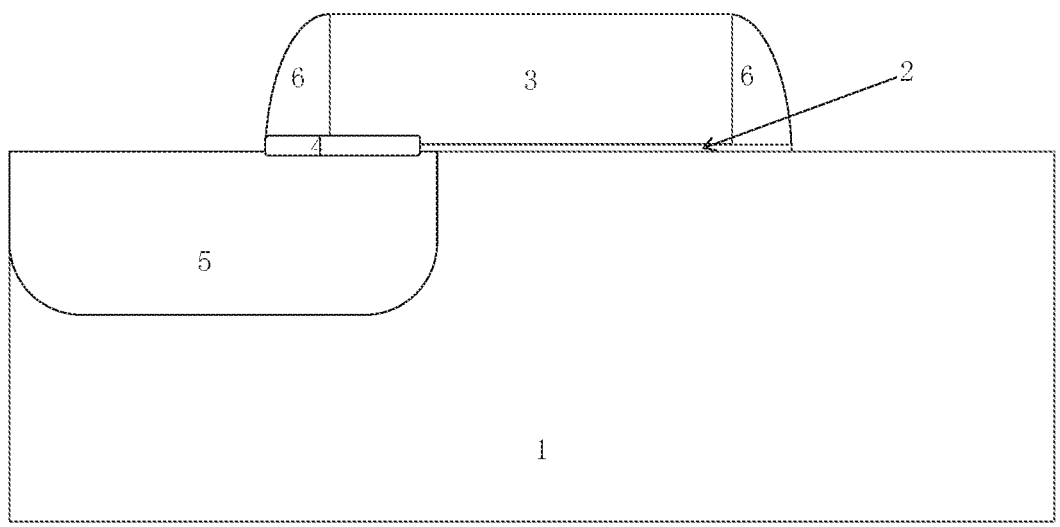

Step 8: as shown in FIG. 3E, prior to performing source/drain implantation, side walls 6 are formed on the sides of polysilicon gate 3 with deposition and etching processes.

As shown in FIG. 2, when performing source/drain implantation of impurity having the first conductivity type, heavily doped source/drain implanted regions 7 are formed on both sides of polysilicon gate 3; side walls 6 on the two sides of polysilicon gate 3 are taken as the boundaries for self-alignment, source/drain implantation is performed at a tilt angle, source/drain implanted regions 7 formed thereby extend horizontally to the bottom of side walls 6, and the breadth of the horizontal extension of source/drain implanted regions 7 is greater than the maximum horizontal breadth of side walls 6. Preferably, the angle between the ion beam and the vertical direction is greater than 10 degrees, and the implantation dose exceeds 5E14 cm$^{-2}$ in source/drain implantation.

The overlap between source/drain implanted region 7 on the first side of polysilicon gate 3 and lightly doped drain region 5 forms the drain region, and source/drain implanted region 7 on the second side of polysilicon gate 3 forms the source region.

The source and drain regions are unsymmetrical in structure, wherein the horizontal junction depth of the drain region is greater than that of the source region, and the vertical junction depth of the drain region is greater than that of the source region; the breakdown voltage of the device can be raised by increasing the horizontal and vertical junction depths of the drain region, and the horizontal dimension of the device can be diminished by reducing the horizontal and vertical junction depths of the source region.

In accordance with the embodiment of the present invention, the MOSFET is an N-type device, with the first conductivity type being N-type and the second conductivity type being P-type. In alternative embodiments, the MOSFET may be a P-type device, with the first conductivity type being P-type and the second conductivity type being N-type.

The present invention has been described in great detail by reference to a specific embodiment. But this does not intend to limit the scope of the present invention. Without departing from the spirit of the present invention, a person having ordinary skills in the art may make various modifications and improvements, which shall be considered to fall within the scope of the present invention.

What is claimed is:

1. A method of manufacturing the MOSFET, comprising the steps of:
   step 1: providing a semiconductor substrate and introducing dopant having the second conductivity type in the surface thereof to form a well region;
   step 2: forming a first oxide layer on the surface of said semiconductor substrate by thermal oxidation or chemical vapor deposition;
   step 3: forming a polysilicon gate on the surface of the first oxide layer by chemical vapor deposition and photolithography, wherein said polysilicon gate covers the surface of said well region via said first oxide layer;
   step 4: forming a first dielectric layer by chemical vapor deposition, wherein said first dielectric layer is made of silicon nitride or silicon oxynitride;
   step 5: removing said first dielectric layer in a formation region of a drain region with photolithography and etching processes, while retaining said first dielectric layer on the surface of the first oxide layer on the semiconductor substrate in a formation region of a source region, wherein said formation region of the drain region is located outside a first side of said polysilicon gate, said formation region of the source region is located outside a second side of said polysilicon gate, the reserved part of said first dielectric layer further extends from formation region of the source region to the top of said polysilicon gate, and a region where the first dielectric layer is removed further extends from said formation region of the drain region to the top of said polysilicon gate;
   step 6: with a photoresist formed in photolithography process on said first dielectric layer and the top thereof as a mask, conducting ion implantation of dopants having the first conductivity type to form a lightly doped drain region, wherein said lightly doped drain region is self-aligned with the first side of said polysilicon gate; the junction depth of the drain region is adjusted through ion implantation of said lightly doped drain region; and horizontally, said lightly doped drain region extends from the first side of said polysilicon gate to the bottom thereof, thereby forming an overlap between said drain region and said polysilicon gate;
   step 7: removing the photoresist on the top of said first dielectric layer, and with said first dielectric layer as a mask, performing local thermal oxidation to form a local thermal oxide layer, wherein said local thermal oxide layer extends from said formation region of the drain region to the bottom of said polysilicon gate, and then removing said first dielectric layer;
   said first oxide layer located at the bottom of said polysilicon gate and not overlaid with said local thermal oxide layer constitutes a second gate dielectric section and said local thermal oxide layer extending to the bottom of said polysilicon gate constitutes a first gate dielectric section;

said first gate dielectric section and said second gate dielectric section are connected horizontally to form a gate dielectric layer; said first gate dielectric section is located in the overlap between said drain region and said polysilicon gate; the GIDL effect in the device can be reduced by increasing the thickness of said first gate dielectric section, and the driving current of the device can be increased by reducing the thickness of said second gate dielectric section;

step 8: performing source/drain implantation of impurity having the first conductivity type to form heavily doped source/drain implanted regions on both sides of said polysilicon gate, wherein each said source/drain implanted region is self-aligned with a corresponding side of said polysilicon gate, the overlap between said source/drain implanted region on the first side of said polysilicon gate and said lightly doped drain region forms a drain region, and said source/drain implanted region on the second side of said polysilicon gate forms a source region;

said source region and said drain region are unsymmetrical in structure, wherein the horizontal junction width of said drain region is greater than that of said source region, and the vertical junction depth of said drain region is greater than that of said source region; the breakdown voltage of the device can be raised by increasing the horizontal and vertical junction depths of said drain region, and the horizontal dimension of the device can be diminished by reducing the horizontal and vertical junction depths of said source region.

2. The method of manufacturing a MOSFET of claim 1, wherein said semiconductor substrate is a silicon substrate.

3. The method of manufacturing the MOSFET of claim 1, wherein prior to performing said source/drain implantation in Step 8, side walls are formed on the sides of said polysilicon gate by deposition and etching processes;

when performing said source/drain implantation, said side walls on the two sides of said polysilicon gate are taken as the boundaries for self-alignment, said source/drain implantation is performed at a tilt angle, said source/drain implanted regions formed thereby extend horizontally to the bottom of said side walls, and the breadth of the horizontal extension of said source/drain implanted regions is greater than the maximum horizontal breadth of said side walls.

4. The method of manufacturing a MOSFET of claim 3, wherein the angle between the ion beam and the vertical direction is greater than 10 degrees and the implantation dose exceeds $5E14$ $cm^{-2}$ in said source/drain implantation.

5. The method of manufacturing a MOSFET of claim 1, wherein the angle between the ion beam and the vertical direction is greater than 10 degrees and the implantation dose exceeds $5E14$ $cm^{-2}$ in said ion implantation of dopants to form a lightly doped drain region in Step 6.

6. The method of manufacturing a MOSFET of claim 1, wherein the thickness of said first dielectric layer is between 50 and 300 angstroms.

7. The method of manufacturing a MOSFET of claim 1, wherein the thickness of said local thermal oxide layer is between 30 and 300 angstroms.

8. The method of manufacturing a MOSFET of claim 1, wherein the MOSFET is an N-type device, with the first conductivity type being N-type and the second conductivity type being P-type; alternatively, the MOSFET is a P-type device, with the first conductivity type being P-type and the second conductivity type being N-type.

* * * * *